(12) United States Patent
Raghunathan

(10) Patent No.: US 8,956,789 B2
(45) Date of Patent: Feb. 17, 2015

(54) METHODS FOR FABRICATING INTEGRATED CIRCUITS INCLUDING MULTI-PATTERNING OF MASKS FOR EXTREME ULTRAVIOLET LITHOGRAPHY

(71) Applicant: GLOBALFOUNDRIES, Inc., Grand Cayman (KY)

(72) Inventor: Sudharshanan Raghunathan, Guilderland, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/832,994

(22) Filed: Mar. 15, 2013

(65) Prior Publication Data
US 2014/0273306 A1    Sep. 18, 2014

(51) Int. Cl.
*H01L 21/66* (2006.01)

(52) U.S. Cl.
CPC .................... *H01L 22/10* (2013.01)
USPC .............. 430/5; 430/30; 430/311; 430/15; 430/322; 430/330; 438/15; 378/35; 382/144

(58) Field of Classification Search
CPC ........................................ H01L 22/10
USPC .......... 430/30, 311–331, 394, 5; 438/15, 945, 438/947
See application file for complete search history.

(56) References Cited

U.S. PATENT DOCUMENTS

| 8,168,352 B2 * | 5/2012 | Hayashi et al. | 430/5 |
| 8,592,103 B2 * | 11/2013 | Mangat et al. | 430/5 |
| 2013/0029253 A1 | 1/2013 | Mangat et al. | |

* cited by examiner

*Primary Examiner* — Zandra Smith
*Assistant Examiner* — Damian A Hillman
(74) *Attorney, Agent, or Firm* — Ingrassia Fisher & Lorenz, P.C.

(57) ABSTRACT

Methods for fabricating integrated circuits are provided. In one example, a method for fabricating an integrated circuit includes patterning a first photoresist layer overlying a mask blank that is mounted on a first chuck to form a first patterned photoresist layer. The mask blank is selectively etched using the first patterned photoresist layer to form a first patterned mask. The first patterned mask is mounted on a second chuck and a non-flatness compensation is determined. The first patterned mask is mounted on the first chuck and a second photoresist layer is patterned overlying the first patterned mask to form a second patterned photoresist layer. The second patterned photoresist layer includes a device pattern that has been adjusted using the non-flatness compensation. The first patterned mask is selectively etched using the second patterned photoresist layer to form a second patterned mask.

20 Claims, 5 Drawing Sheets

METHODS FOR FABRICATING INTEGRATED CIRCUITS INCLUDING MULTI-PATTERNING OF MASKS FOR EXTREME ULTRAVIOLET LITHOGRAPHY

TECHNICAL FIELD

The technical field relates generally to methods for fabricating integrated circuits, and more particularly relates to methods for fabricating integrated circuits including multi-patterning of masks for extreme ultraviolet lithography.

BACKGROUND

Extreme ultraviolet lithography (EUVL) is an emerging technology enabling the fabrication of integrated circuits with semiconductor devices having critical dimensions of less than 28 nanometers (nm) in width. In contrast to conventional lithographical techniques, EUVL utilizes extreme ultraviolet light to transfer a device pattern (e.g., circuit layout pattern) from a reflective mask (e.g., reticle) to a semiconductor wafer.

The reflective masks for EUVL are typically formed from a mask blank that includes a substrate, a reflective layer section that is formed of multiple reflector layers overlying the substrate, and an absorber layer overlying the reflective layer section. The reflective layer section and the absorber layer are tuned to be predominantly reflective and absorptive, respectively, of extreme ultraviolet light at a chosen EUV wavelength, which is typically about 13.5 nm.

Utilizing conventional lithography, a reflective mask is formed by mounting a mask blank on a vacuum chuck (e.g., a fixture configured to retain a mask via a vacuum) and patterning the absorber layer to expose selected areas of the underlying reflective layer section corresponding to the desired device pattern. The reflective mask is then moved to an EUVL tool for transferring the device pattern from the reflective mask to a semiconductor wafer. Because air readily absorbs extreme ultraviolet light (e.g., at a wavelength of about 13.5 nm), the EUVL process is carried out in a vacuum inside an EUVL tool to allow transmission of the extreme ultraviolet light. As such, in the EUVL tool, the reflective mask is mounted on an electrostatic chuck (e.g., a fixture configured to retain a mask via an electrostatic charge) instead of a conventional vacuum chuck because the vacuum chuck would be ineffective to retain the reflective mask when both the vacuum chuck and the reflective mask are in a vacuum.

The topography of a mask, and particularly of a reflective mask constructed for an EUVL process, is often different when mounted on a conventional vacuum chuck than when mounted on an electrostatic chuck. In particular, the substrate that is used for making the mask is polished to nanometer scale flatness and has some characteristic undulations resulting from the imperfect polished process. In addition, the multiple reflector and absorber layers formed overlying the substrate of the reflective mask (e.g., mask blank and reflective mask) produce interlaminar stresses that result in undulations and/or non-flatness of the outer surfaces of the reflective mask at the micrometer scale (e.g., >about 1 μm). When mounted on a vacuum chuck, the reflective mask is typically supported by a multi-point mount arrangement allowing the reflective mask some room to relax without fully constraining the undulations and/or non-flatness of the mask's outer surfaces. When mounted on an electrostatic chuck, the reflective mask is more constrained by a substantially flat plate and the large force produced from the electrostatic charge, thereby improving flatness (e.g., reducing non-flatness) of the outer surfaces of the reflective mask. Since the device pattern is transferred to the mask blank when the mask blank is mounted on the vacuum chuck and is less flat, and the device pattern is transferred from the reflective mask to the semiconductor wafer when the reflective mask is mounted on the electrostatic chuck and is more flat, topographical differences of the reflective mask due to different mounting arrangements ultimately results in image translational errors (also referred to herein as "intra-field errors") of the device pattern to the semiconductor wafer. Intra-field errors can limit device scaling and reduce product yield.

Accordingly, it is desirable to provide methods for fabricating integrated circuits including patterning of masks for extreme ultraviolet lithography that ultimately reduce intra-field errors. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes patterning a first photoresist layer overlying a mask blank that is mounted on a first chuck to form a first patterned photoresist layer. An absorber layer of the mask blank is selectively etched using the first patterned photoresist layer to form a first patterned mask that includes fiducials. The first patterned mask is mounted on a second chuck and a non-flatness compensation is determined for the first patterned mask mounted on the first chuck relative to being mounted on the second chuck using the fiducials. The first patterned mask is mounted on the first chuck and a second photoresist layer is patterned overlying the first patterned mask to form a second patterned photoresist layer. The second patterned photoresist layer includes a device pattern that has been adjusted using the non-flatness compensation. The absorber layer of the first patterned mask is selectively etched using the second patterned photoresist layer to form a second patterned mask that includes the device pattern.

In accordance with another exemplary embodiment, a method for fabricating an integrated circuit is provided. The method includes mounting a mask blank on a first chuck and patterning a first photoresist layer overlying the mask blank to form a first patterned photoresist layer. Fiducials are formed into the mask blank using the first patterned photoresist layer to define a first patterned mask. The first patterned mask is mounted on a second chuck and a non-flatness compensation is determined for the first patterned mask mounted on the first chuck relative to being mounted on the second chuck using the fiducials. A device pattern is adjusted using the non-flatness compensation. The first patterned mask is mounted on the first chuck and a second photoresist layer overlying the first patterned mask is patterned with the device pattern to form a second patterned photoresist layer. The device pattern is transferred to the first patterned mask using the second patterned photoresist layer to form a second patterned mask.

In accordance with another exemplary embodiment, a method for fabricating an integrated circuit is provided. The method includes patterning a first photoresist layer overlying a mask blank that is mounted on a first chuck to form a first patterned photoresist layer. Fiducials are formed into the mask blank using the first patterned photoresist layer to define a first patterned mask. The first patterned mask is mounted on a second chuck and a non-flatness compensation is determined for the first patterned mask mounted on the first chuck relative to being mounted on the second chuck using the fiducials. The first patterned mask is mounted on the first chuck and a second photoresist layer overlying the first patterned mask is patterned to form a second patterned photoresist layer. The second patterned photoresist layer includes a device pattern that has been adjusted using the non-flatness compensation. The device pattern is transferred to the first patterned mask using the second patterned photoresist layer to form a second patterned mask. A third photoresist layer is deposited overlying a semiconductor wafer. The third photoresist layer is patterned using the second patterned mask that is mounted on the second chuck to form a third patterned photoresist layer. The semiconductor wafer is selectively etched using the third patterned photoresist layer to form a patterned semiconductor wafer that includes the device pattern.

BRIEF DESCRIPTION OF THE DRAWINGS

The various embodiments will hereinafter be described in conjunction with the following drawing figures, wherein like numerals denote like elements, and wherein:

FIGS. 1-8 illustrate, in various views, a mask for forming an integrated circuit using extreme ultraviolet lithography and a method for forming an integrated circuit during various fabrication stages in accordance with an exemplary embodiment.

FIGS. 1-4A are cross-sectional views of a mask for forming an integrated circuit using extreme ultraviolet lithography during various fabrication stages in accordance with an exemplary embodiment;

FIGS. 5-7A are cross-sectional views of a mask for forming an integrated circuit using extreme ultraviolet lithography during various later fabrication stages in accordance with an exemplary embodiment;

FIG. 8 is a cross-sectional view of an integrated circuit during an intermediate fabrication stage in accordance with an exemplary embodiment.

DETAILED DESCRIPTION

Figure 1:
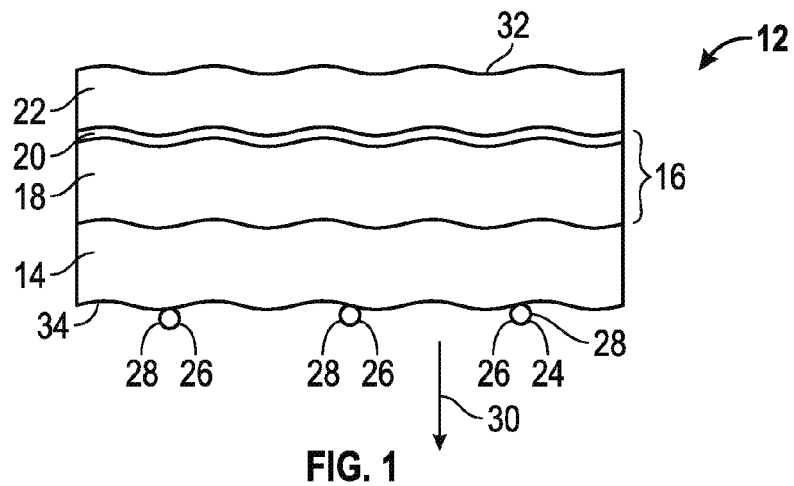

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits. The exemplary embodiments taught herein mount a mask blank on a first chuck. The mask blank includes a reflective layer section formed, for example, of multiple reflector layers that overlie a substrate, and an absorber layer that overlies the reflective layer section. In an exemplary embodiment, the first chuck is a vacuum chuck and the mask blank is patterned using, for example, a conventional electron beam lithography process to form a first patterned mask that includes fiducials (e.g., reference patterns or structures).

The first patterned mask is subsequently mounted on a second chuck. In an exemplary embodiment, the second chuck is an electrostatic chuck that is arranged in an extreme ultraviolet lithography (EUVL) tool. The EUVL tool is configured to scan the first patterned mask including scanning the fiducials for determining a non-flatness compensation. The non-flatness compensation defines a spatial correction for adjusting the non-flatness of the mask being mounted on the first chuck to topographically substantially match the improved flatness of the mask being mounted on the second chuck. In an exemplary embodiment, because the fiducials are defined (e.g., transferred and/or formed) to the mask when the mask blank is mounted on the first chuck and are scanned when the first patterned mask is mounted on the second chuck, the fiducials can be used to determine, measure, and/or calculate the spatial or topographical differences between the mask being mounted on the first and second chucks to determine the non-flatness compensation.

The non-flatness compensation is used to adjust a device pattern that was generated, for example, with a computer aided design (CAD) program. In an exemplary embodiment, the device pattern is adjusted by moving or repositioning patterned features in accordance with the spatial correction defined by the non-flatness compensation. The first patterned mask is mounted back on the first chuck and the device pattern, which has been adjusted, is transferred to the first patterned mask using, for example, a conventional lithography process to form a second patterned mask.

In an exemplary embodiment, the second patterned mask is moved to the EUVL tool and is mounted back on the second chuck. The device pattern is then transferred from the second patterned mask to a semiconductor wafer using an EUVL process to form a patterned semiconductor wafer. It has been found that by adjusting the device pattern with the non-flatness compensation, polishing imperfections and topographical differences of the mask due to different mounting arrangements can be accounted for to reduce intra-field errors from transferring the device pattern to the mask and then from the mask to the semiconductor wafer.

FIGS. 1-8 illustrate methods for fabricating an integrated circuit 10 (shown in FIG. 8) in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the manufacture of integrated circuits are well known and so, in the interest of brevity, many conventional steps will only be mentioned briefly herein or will be omitted entirely without providing the well-known process details.

FIG. 1 illustrates, in cross-sectional view, a mask blank 12 for an EUVL process used during an early fabrication stage of the integrated circuit 10 (shown in FIG. 8) in accordance with an exemplary embodiment. The mask blank 12 is obtained by independent production or by purchase from a commercial supplier. The mask blank 12 includes a substrate 14, a reflective layer section 16 formed of a multi-layer reflector 18 and a capping layer 20 that are formed over the substrate 14, and an absorber layer 22 that is formed over the reflective layer section 16. In an exemplary embodiment, the substrate 14 is fabricated from a material having a relatively low coefficient of thermal expansion, such as synthetic quartz. Although the thickness of the substrate 14 can vary, in one embodiment, the substrate 14 has a thickness of from about 5 to about 7.5 mm.

The reflective layer section 16 includes the multi-layer reflector 18 that can include any number of layers formed from any material or group of materials suitable for predominately reflecting incident extreme ultraviolet (EUV) light at a selected wavelength (e.g., about 13.5 nm). In an exemplary embodiment, the multi-layer reflector 18 includes a number of alternating molybdenum and silicon layers that together reflect about 64% of incident EUV light. In this exemplary case, the alternating molybdenum and silicon layers can each have a thickness of from about 2.78 to about 4.17 nm. As illustrated, the capping layer 20 is formed overlying the multi-layer reflector 18 to help protect the alternating molybdenum and silicon layers from any etching processes during mask patterning. In an exemplary embodiment, the capping layer 20 is formed of ruthenium and has a thickness of from about 0.25 to about 2 nm.

The absorber layer 22 can include one or more layers formed from any material or group of materials suitable for predominately absorbing incident EUV light at the selected wavelength (e.g., 13.5 nm). The absorptivity of the absorber layer 22 will vary in conjunction with thickness and composition. In an exemplary embodiment, the absorber layer 22 will include a plurality of tantalum-containing layers, such as tantalum boron nitride (TaBN) and/or tantalum boron oxide (TaBO) each having a thickness of from about 14 to about 56 nm. In this exemplary case, the absorber layer 22 may absorb approximately about 97% or greater of incident EUV light at the selected wavelength. Other non-limiting examples of tantalum-containing layers suitable for forming the absorber layer 22 include a tantalum nitride (TaN) layer(s) and a tantalum oxide (TaO) layer(s).

The mask blank 12 is mounted on a chuck 24. As illustrated, the chuck 24 is configured as a vacuum chuck 26 having a multi-point mount arrangement 28 (e.g., 3-point mount arrangement) with open spaces between adjacent mounts for pulling a vacuum (indicated by single headed arrow 30) to retain the mask blank 12 against the multi-point mount arrangement 28. As discussed above, the multiple layers of the multi-layer reflector 18, the capping layer 20, and the absorber layer 22 that are formed overlying the substrate 14 produce interlaminar stresses between the layers that result in undulations and/or non-flatness of the outer surfaces 32 and 34 at the micrometer scale (e.g., >about 1 μm). As such, when the mask blank 12 is mounted on the vacuum chuck 26, the multi-point mount arrangement 28 allows the mask blank 12 some room to relax without fully constraining the undulations and/or non-flatness of the outer surfaces 32 and 34 and therefore, the topography of the mask blank 12 is substantially non-flat at the micrometer scale.

Figure 2:
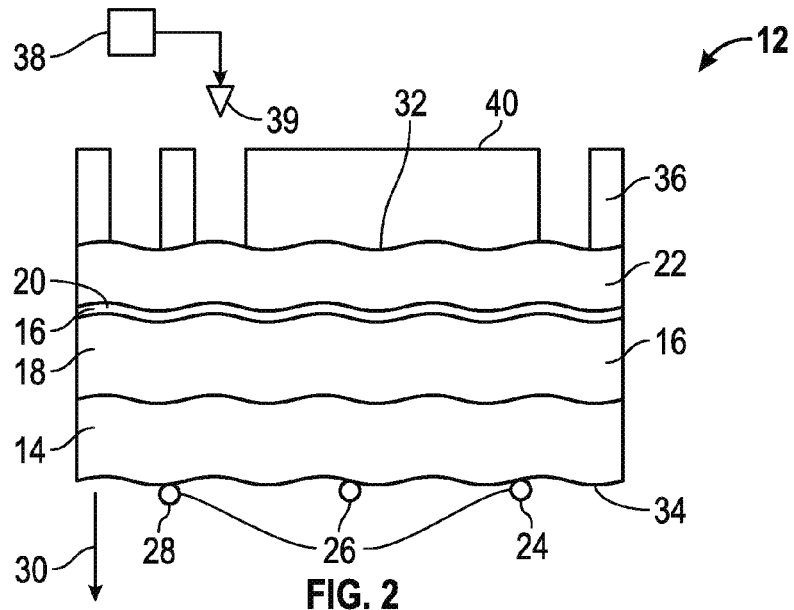
Figure 3:
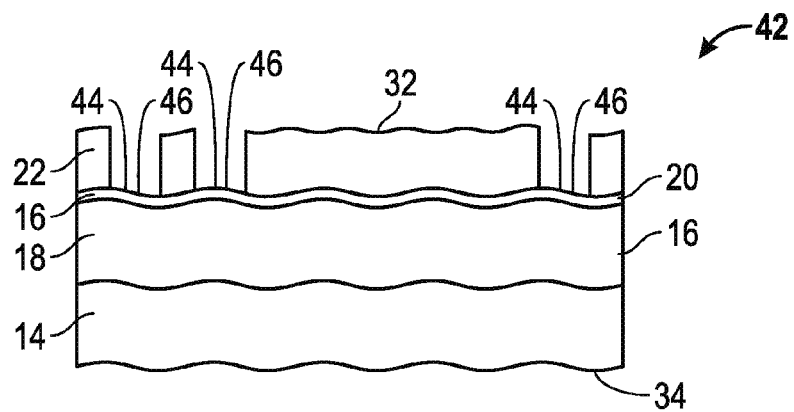

FIG. 2 illustrates, in cross-sectional view, the mask blank 12 at a further advanced fabrication stage in accordance with an exemplary embodiment. A photoresist layer 36 is deposited overlying the mask blank 12. A pattern 38 including fiducial features is generated, for example, on a CAD system. Using conventional lithographic techniques, the photoresist layer 36 is exposed to an electron beam (E-beam) 39, for example, that writes the pattern 38 to the photoresist layer 36 to form a patterned photoresist layer 40 that includes the fiducial patterns. The method continues as illustrated in FIG. 3 by selectively etching the absorber layer 22 using the patterned photoresist layer 40 to form a patterned mask 42. In an exemplary embodiment, the absorber layer 22 is selectively removed using a dry etching process, such as a reactive ion exchange (RIE) plasma process. As illustrated, a portion 44 of the reflective layer section 16 is exposed by selectively etching the absorber layer 22 to define fiducials 46.

Figure 4A:
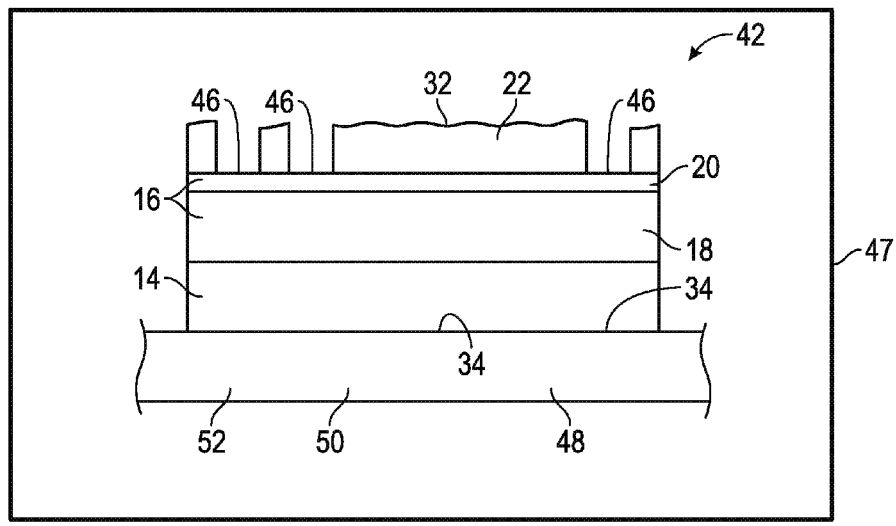

FIG. 4A illustrates, in cross-sectional view, the patterned mask 42 at a further advanced fabrication stage in accordance with an exemplary embodiment. The patterned mask 42 is moved to an EUVL tool 47 and mounted on a chuck 48. As illustrated, the chuck 48 is an electrostatic chuck 50 including a flat plate 52 and configured to produce an electrostatic charge to retain the patterned mask 42 against the flat plate 52.

In an exemplary embodiment, the electrostatic charge is sufficiently large to effectively draw the outer surface 34 of the patterned mask 42 directly against the flat plate 52 to substantially reduce, minimize, or eliminate the undulations and/or non-flatness of the outer surface 34, for example, at the micrometer scale. The outer surface 32 in response to the flattening of the outer surface 34, also becomes substantially flat at the micrometer scale with possibly some relatively small undulations and/or non-flatness, such as, for example, <about 0.25 μm.

Figure 4B:
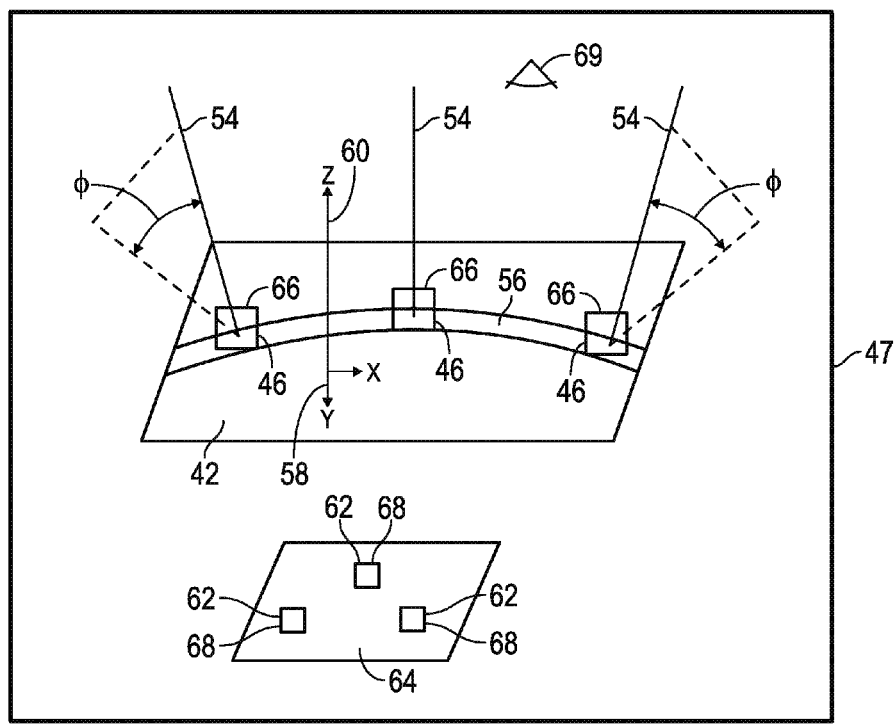
FIG. 4B is a perspective view of the mask depicted in FIG. 4A.
Figure 4C:
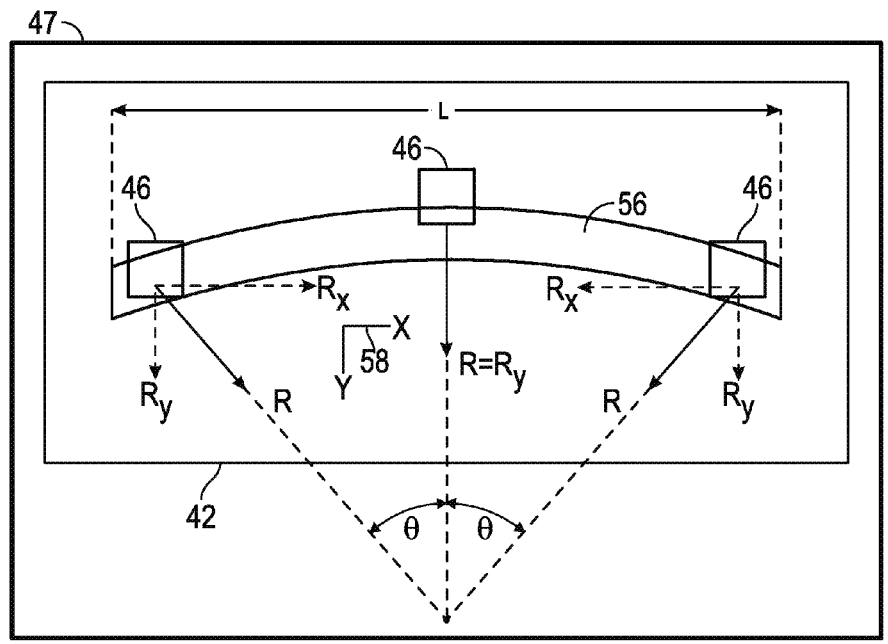
FIG. 4C is a plan view of the mask depicted in FIG. 4A.

FIGS. 4B and 4C illustrate, in a perspective and a plan view, respectively, the patterned mask 42 mounted inside the EUVL tool 47 in accordance with an exemplary embodiment. Referring to FIGS. 4A-4C, the method continues by scanning the patterned mask 42 including the fiducials 46 with EUV light 54. In an exemplary embodiment, the EUV light 54 has a wavelength of from about 10 to about 14 nm, such as from about 13.4 to about 13.6 nm, for example about 13.5 nm. The EUV light 54 is projected onto the patterned mask 42 at an incident angle φ and forms an arc 56. In an exemplary embodiment, the incident angle φ is from about 2 to about 10°, such as from about 4 to about 8°, for example about 6°. The arc 56 has a cord length L and is defined by an angle 2θ. In an exemplary embodiment, the cord length L. is from about 80 to about 120 mm, such as about 100 to about 105 mm, for example about 102 mm, and θ is from about 20 to about 30°, such as from about 23 to about 26°, such as from about 24 to about 25°, for example about 24.6°.

As illustrated, the fiducials 46 are positioned substantially along a X and Y axis plane 58. Perpendicular to the X and Y axis plane 58 is a Z axis 60. In an exemplary embodiment, because the fiducials 46 were transferred to the mask blank 12 (shown in FIGS. 2-3) when the mask blank 12 (shown in FIGS. 2-3) was mounted on the chuck 24 and are now being scanned when the patterned mask 42 is mounted on the chuck 48, the fiducials 46 can provide information regarding the spatial or topographical differences between the mask being mounted on the chuck 24 and the chuck 48 to assess X, Y, and/or Z coordinate errors for each of the fiducials 46. X and Y coordinate errors with respect to the fiducials 46 are herein understood to be deviations in the positions of the fiducials 46 along the X and Y axis plane 58 when the patterned mask 42 is mounted on the chuck 48 compared to their intended X and Y axis positions defined by the pattern 38 (shown in FIG. 2). Z coordinate errors with respect to the fiducials 46 are herein understood to be deviations in the positions of the fiducials 46 along the Z axis 60 when the patterned mask 42 is mounted on the chuck 48 compared to their intended Z axis positions defined by the pattern 38 (shown in FIG. 2).

In an exemplary embodiment, the X and Y coordinate errors for each of the fiducials 46 is determined by comparing the X and Y coordinate positions of the fiducials 46 to corresponding reference standard fiducials 62 formed into a semiconductor wafer 64. In particular, the corresponding reference standard fiducials 62 substantially match the intended X and Y positions defined in the pattern 38 (shown in FIG. 2). In one non-limiting example, the fiducials 46 may be configured as inner boxes 66 and the corresponding reference standard fiducials 62 may be configured as outer boxes 68. If the inner boxes 66 deviate from their intended positions, then X and Y coordinate errors can be directly measured by comparing the X and Y positions of the inner boxes 66 to the X and Y positions of the outer boxes 68. In an exemplary embodiment, the X and Y coordinate errors between the fiducials 46 can also be determined by interpolating the X and Y coordinate errors of the fiducials 46 so that a substantially complete set of X and Y coordinates errors for the patterned mask 42 is obtained.

In an alternative exemplary embodiment, the X and Y coordinate errors for each of the fiducials 46 is determined by initially measuring the Z coordinate errors. In an exemplary embodiment, the EUVL tool 47 has a sensor 69 (e.g., camera) that is configured to determine a corresponding Z-height focal error ($\Delta Z$) for each of the fiducials 46. In an exemplary embodiment, the Z-height focal error ($\Delta Z$) for each of the fiducials 46 is the deviation in the position of the fiducial 46 along the Z axis 60 from its intended Z axis position defined in the pattern 38 (shown in FIG. 2). As such, the Z-height focal error and the Z coordinate error are the same value. The X and Y coordinate errors for the fiducials 46 can then be calculated with the Z-height focal errors ($\Delta Z$) using the relationships of the X coordinate error ($R_x$) defined by $R_x=(\Delta Z/40) \sin \theta$ and the Y coordinate error ($R_y$) defined by $R_y=(Z/40) \cos \theta$. Other methods for determining X and Y coordinate errors of the fiducials 46 may also be used.

Figure 5:
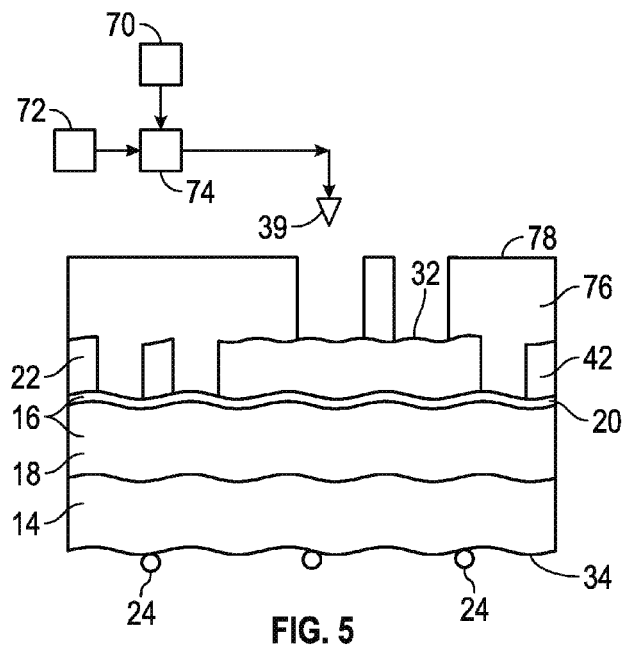

FIG. 5 illustrates, in a cross-sectional view, the patterned mask 42 at a further advanced fabrication stage in accordance with an exemplary embodiment. In an exemplary embodiment, the X and Y coordinate errors are used to determine a non-flatness compensation 70. As discussed above, the non-flatness compensation 70 defines a spatial correction for adjusting the non-flatness of the mask being mounted on the chuck 24 to topographically substantially match the improved flatness of the mask being mounted on the chuck 48. The non-flatness compensation 70 is used to adjust a device pattern 72 to form an adjusted device pattern 74. The non-flatness compensation can be implemented either by pre-correcting the device pattern in a computer aided design program (CAD) or by configuring the mask writer tool to reposition the device pattern during photoresist layer patterning in accordance with the determined non-Latin as compensation 70. The device pattern 72 may be generated using, for example, a computer aided design (CAD) program. In an exemplary embodiment, the device pattern 72 is adjusted by moving or repositioning patterned features in accordance with the spatial correction defined by the non-flatness compensation 70 to form the adjusted device pattern 74.

Figure 6:
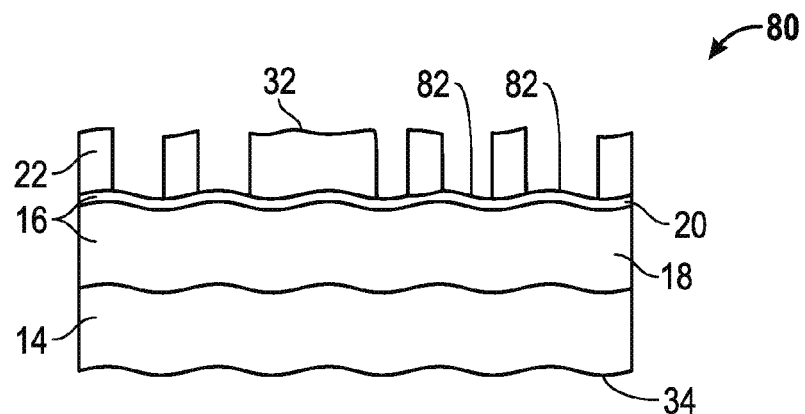

As illustrated, the patterned mask 42 is mounted back on the chuck 24 and a photoresist layer 76 is deposited overlying the patterned mask 42. Using conventional lithographic techniques, the photoresist layer 76 is exposed to the electron beam (E-beam) 39, for example, that writes the adjusted device pattern 74 to the photoresist layer 76 to form a patterned photoresist layer 78 that includes the adjusted device pattern 74. The method continues as illustrated in FIG. 6 by selectively etching the absorber layer 22 using the patterned photoresist layer 76 to form a patterned mask 80. In an exemplary embodiment, the absorber layer 22 is selectively removed using a dry etching process, such as a reactive ion exchange (RIE) plasma process. As illustrated, a portion 82 of the reflective layer section 16 is exposed by selectively etching the absorber layer 22 to define the adjusted device pattern 74 (shown in FIG. 5) in the patterned mask 80.

Figure 7A:
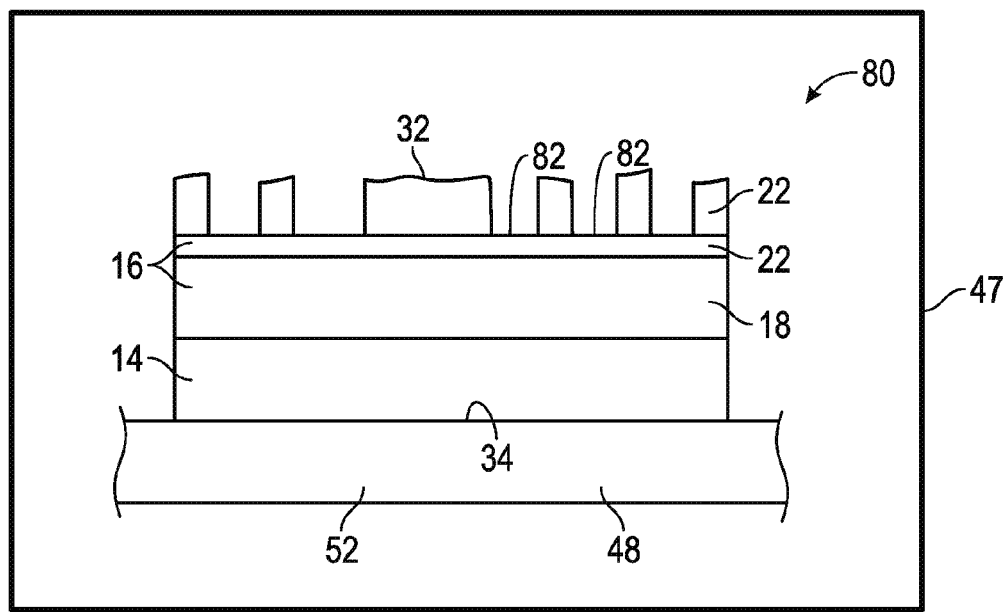

FIG. 7A illustrates, in cross-sectional view, the patterned mask 80 at a further advanced fabrication stage in accordance with an exemplary embodiment. The patterned mask 80 is moved to the EUVL tool 47 and mounted back on the chuck 48. As discussed above, the electrostatic charge produced by the chuck 48 is sufficiently large to effectively draw the outer surface 34 of the patterned mask 80 directly against the flat plate 52 to substantially reduce, minimize, or eliminate the undulations and/or non-flatness of the outer surface 34, for example, at the micrometer scale. The outer surface 32 in response to the flattening of the outer surface 34 also becomes substantially flat at the micrometer scale. The flattening of the patterned mask 80 effectively repositions the portion 82 of the patterned mask 80 from substantially matching the adjusted device pattern 74 (shown in FIG. 5) to substantially matching the device pattern 72 (shown in FIG. 5).

Figure 7B:
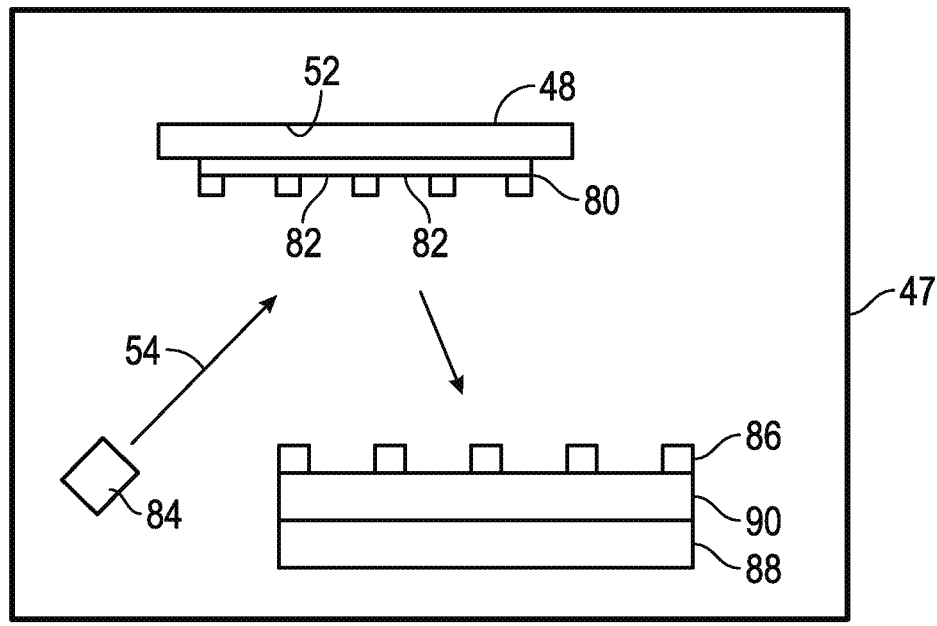
FIG. 7B is a cross-sectional view of the mask depicted in FIG. 7A and an integrated circuit during an early fabrication stage in accordance with an exemplary embodiment.

Referring also to FIG. 7B, the method continues by directing EUV light 54 from a EUV light source 84 to the patterned mask 80 to illuminate the portion 82 of the reflective layer section 16 that define the device pattern 72 (shown in FIG. 5). The portion 82 reflect, in substantial part, the EUV light 54 impinging upon the patterned mask 80 onto a photoresist layer 86 deposited over a semiconductor wafer 88.

Figure 8:
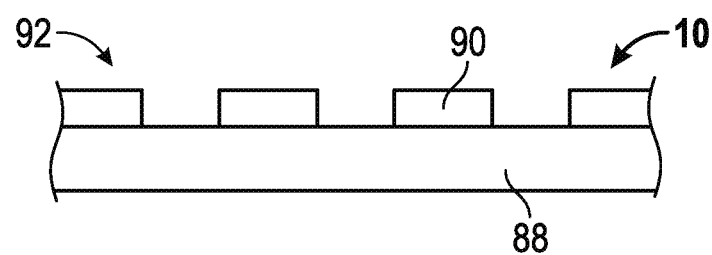

Referring to FIGS. 7B and 8, conventional lithographical techniques are then utilized to transfer the image from the photoresist layer 86 to a semiconductor device layer 90 of the semiconductor wafer 88 to form the integrated circuit 10 including a patterned semiconductor wafer 92. In an exemplary embodiment, the patterned semiconductor wafer 92 defines a pattern substantially matching the device pattern 72 (shown in FIG. 5).

Accordingly, methods for fabricating integrated circuits have been described. The exemplary embodiments taught herein mount a mask blank on a first chuck. The mask blank includes a reflective layer section that overlie a substrate, and an absorber layer that overlies the reflective layer section. In an exemplary embodiment, the mask blank is patterned using, for example, a conventional lithography process to form a first patterned mask that includes fiducials. The first patterned mask is then mounted on a second chuck. The second chuck is arranged in an EUVL tool. The first patterned mask is then scanned to determine a non-flatness compensation. The non-flatness compensation is used to adjust a device pattern that was generated, for example, with a CAD program. The first patterned mask is mounted back on the first chuck and the device pattern, which has been adjusted, is transferred to the first patterned mask using, for example, a conventional lithography process to form a second patterned mask. The second patterned mask is moved to the EUVL tool and is mounted back on the second chuck. The device pattern is then transferred from the second patterned mask to a semiconductor wafer using an EUVL process to form a patterned semiconductor wafer.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
    patterning a first photoresist layer overlying a mask blank that is mounted on a first chuck to form a first patterned photoresist layer;
    selectively etching an absorber layer of the mask blank using the first patterned photoresist layer to form a first patterned mask that includes fiducials;

mounting the first patterned mask on a second chuck and determining a non-flatness compensation for the first patterned mask mounted on the first chuck relative to being mounted on the second chuck using the fiducials;

mounting the first patterned mask on the first chuck and patterning a second photoresist layer overlying the first patterned mask to form a second patterned photoresist layer including a device pattern that has been adjusted using the non-flatness compensation; and selectively etching the absorber layer of the first patterned mask using the second patterned photoresist layer to form a second patterned mask that includes the device pattern.

2. The method of claim 1, wherein selectively etching the absorber layer of the mask blank comprises selectively removing the absorber layer to expose a portion of a reflective layer section of the mask blank underlying the absorber layer.

3. The method of claim 1, wherein selectively etching the absorber layer of the mask blank comprises selectively removing the absorber layer using a reactive ion exchange plasma process.

4. The method of claim 1, wherein mounting the first patterned mask on the second chuck comprises mounting the first patterned mask on an electrostatic chuck that defines the second chuck.

5. The method of claim 1, wherein mounting the first patterned mask on the first chuck comprises mounting the first patterned mask on a vacuum chuck that defines the first chuck.

6. The method of claim 1, wherein selectively etching the absorber layer of the first patterned mask comprises selectively removing the absorber layer to expose a portion of a reflective layer section of the first patterned mask underlying the absorber layer.

7. The method of claim 1, wherein selectively etching the absorber layer of the first patterned mask comprises selectively removing the absorber layer using a reactive ion exchange plasma process.

8. The method of claim 1, further comprising:
transferring the device pattern to a semiconductor wafer using the second patterned mask and an extreme ultraviolet lithography process.

9. A method for fabricating an integrated circuit comprising:

mounting a mask blank on a first chuck and patterning a first photoresist layer overlying the mask blank to form a first patterned photoresist layer;

forming fiducials into the mask blank using the first patterned photoresist layer to define a first patterned mask;

mounting the first patterned mask on a second chuck and determining a non-flatness compensation for the first patterned mask mounted on the first chuck relative to being mounted on the second chuck using the fiducials;

adjusting a device pattern using the non-flatness compensation;

mounting the first patterned mask on the first chuck and patterning a second photoresist layer overlying the first patterned mask with the device pattern to form a second patterned photoresist layer;

transferring the device pattern to the first patterned mask using the second patterned photoresist layer to form a second patterned mask.

10. The method of claim 9, wherein the fiducials are positioned substantially along an X and Y axis plane, and wherein determining the non-flatness compensation comprises determining X and Y coordinate errors for each of the fiducials.

11. The method of claim 10, wherein determining the non-flatness compensation comprises interpolating the X and Y coordinate errors between the fiducials to define interpolated X and Y coordinates errors.

12. The method of claim 9, wherein determining the non-flatness compensation comprises scanning the first patterned mask with extreme ultraviolet light projected onto the first patterned mask as an arc defined by an angle ($2\theta$).

13. The method of claim 12, wherein determining the non-flatness compensation comprises projecting the extreme ultraviolet light as the arc in which $\theta$ is from about 20 to about 30°.

14. The method of claim 12, wherein determining the non-flatness compensation comprises determining a corresponding Z-height focal error ($\Delta Z$) for each of the fiducials.

15. The method of claim 14, wherein determining the non-flatness compensation comprises calculating a X coordinate error ($R_x$) and a Y coordinate error ($R_y$) for each of the fiducials, wherein the X coordinate error is defined by $R_x=(\Delta Z/40) \sin \theta$ and the Y coordinate error is defined by $R_y=(\Delta Z/40) \cos \theta$.

16. A method for fabricating an integrated circuit comprising:

patterning a first photoresist layer overlying a mask blank that is mounted on a first chuck to form a first patterned photoresist layer;

forming fiducials into the mask blank using the first patterned photoresist layer to define a first patterned mask;

mounting the first patterned mask on a second chuck and determining a non-flatness compensation for the first patterned mask mounted on the first chuck relative to being mounted on the second chuck using the fiducials;

mounting the first patterned mask on the first chuck and patterning a second photoresist layer overlying the first patterned mask to form a second patterned photoresist layer including a device pattern that has been adjusted using the non-flatness compensation;

transferring the device pattern to the first patterned mask using the second patterned photoresist layer to form a second patterned mask;

depositing a third photoresist layer overlying a semiconductor wafer;

patterning the third photoresist layer using the second patterned mask that is mounted on the second chuck to form a third patterned photoresist layer; and selectively etching the semiconductor wafer using the third patterned photoresist layer to form a patterned semiconductor wafer that includes the device pattern.

17. The method of claim 16, wherein transferring the device pattern to the first patterned mask comprises selectively etching an absorber layer of the first patterned mask using the second patterned photoresist layer to remove a first portion of the absorber layer and to expose a second portion of a reflective layer section underlying the absorber layer, and wherein patterning the third photoresist layer comprises exposing the second portion of the reflective layer section to an extreme ultraviolet light to transfer the device pattern to the third photoresist layer and form the third patterned photoresist layer.

18. The method of claim 17, wherein patterning the third photoresist layer comprises exposing the second portion of the reflective layer section to the extreme ultraviolet light in a vacuum.

19. The method of claim 17, further comprising mounting the second patterned mask on an electrostatic chuck that defines the second chuck, and wherein patterning the third photoresist layer comprises patterning the third photoresist layer using the second patterned mask that is mounted on the electrostatic chuck.

20. The method of claim 16, wherein selectively etching the semiconductor wafer comprises selectively etching the semiconductor wafer using a reactive ion exchange plasma process.

* * * * *